United States Patent
Zhang

(10) Patent No.: US 11,928,067 B2
(45) Date of Patent: *Mar. 12, 2024

(54) READ OPERATION CIRCUIT, SEMICONDUCTOR MEMORY, AND READ OPERATION METHOD

(71) Applicant: CHANGXIN MEMORY TECHNOLOGIES, INC., Hefei (CN)

(72) Inventor: Liang Zhang, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 431 days.

This patent is subject to a terminal disclaimer.

(21) Appl. No.: 17/240,922

(22) Filed: Apr. 26, 2021

(65) Prior Publication Data

US 2021/0286750 A1     Sep. 16, 2021

Related U.S. Application Data

(63) Continuation of application No. PCT/CN2020/097399, filed on Jun. 22, 2020.

(30) Foreign Application Priority Data

Oct. 25, 2019     (CN) .......................... 201911021472.4

(51) Int. Cl.
*G06F 13/40*     (2006.01)
*G11C 11/4093*     (2006.01)
(Continued)

(52) U.S. Cl.
CPC ...... *G06F 13/4077* (2013.01); *G11C 11/4093* (2013.01); *G11C 11/4096* (2013.01); *H03M 9/00* (2013.01)

(58) Field of Classification Search
None
See application file for complete search history.

(56) References Cited

U.S. PATENT DOCUMENTS 6,075,735 A     6/2000 Sugibayashi
2014/0298146 A1     10/2014 Brown et al.
(Continued)

FOREIGN PATENT DOCUMENTS

CN     110322915 A     10/2019
KR     20010061369 A     7/2001
KR     20080032970 A     4/2008

OTHER PUBLICATIONS

European Patent Office, Extended European Search Report Issued in Application No. 20879580.7, dated Feb. 25, 2022, Germany, 11 pages.

*Primary Examiner* — Farley Abad
*Assistant Examiner* — Dayton Lewis-Taylor
(74) *Attorney, Agent, or Firm* — Kilpatrick Townsend & Stockton LLP

(57) ABSTRACT

Embodiments provide a read operation circuit, a semiconductor memory, and a read operation method. The read operation circuit includes: a data determination module configured to read read data from a memory bank, and determine whether to invert the read data according to the number of bits of low data in the read data to output global bus data for transmission through a global bus and inversion flag data for transmission through an inversion flag signal line; a data receiving module configured to determine whether to invert the global bus data according to the inversion flag data to output cache data; a parallel-to-serial conversion circuit configured to perform parallel-to-serial conversion on the cache data to generate output data of the (Continued)

DQ port; and a precharge module configured to set an initial state of the global bus to High.

13 Claims, 4 Drawing Sheets

(51) Int. Cl.
*G11C 11/4096* (2006.01)
*H03M 9/00* (2006.01)

(56) References Cited

U.S. PATENT DOCUMENTS

| | | |
|---|---|---|
| 2015/0095520 A1 | 4/2015 | Kwack |
| 2017/0365326 A1 | 12/2017 | Cha et al. |
| 2018/0090218 A1 | 3/2018 | Takada et al. |

READ OPERATION CIRCUIT, SEMICONDUCTOR MEMORY, AND READ OPERATION METHOD

CROSS REFERENCE

This application is a continuation of PCT/CN2020/097399, filed on Jun. 22, 2020, which claims priority to Chinese Patent Application No. 201911021472.4, titled "READ OPERATION CIRCUIT, SEMICONDUCTOR MEMORY, AND READ OPERATION METHOD" and filed to the State Intellectual Property Office on Oct. 25, 2019, the entire contents of which are incorporated herein by reference.

TECHNICAL FIELD

The present disclosure relates to the field of semiconductor memory technologies, and more particularly, to a read operation circuit, a semiconductor memory, and a read operation method.

BACKGROUND

This section is intended to provide a background or context to embodiments the present disclosure that is recited in the claims.

A semiconductor memory includes a static random-access memory (SRAM), a dynamic random access memory (DRAM), a synchronous dynamic random access memory (SDRAM), a read-only memory (ROM), and a flash memory, etc.

In a DRAM protocol of the Joint Electron Device Engineering Council (JEDEC), there are requirements for speed and power saving of the DRAM. How to ensure the DRAM to be more power-saving while ensuring the integrity of a signal and the reliability of data transmission and storage is a problem to be solved urgently in the industry.

SUMMARY

Embodiments of the present disclosure provide a read operation circuit, a semiconductor memory, and a read operation method to solve or alleviate one or more technical problems in the existing technologies.

In a first aspect, the embodiments of the present disclosure provide a read operation circuit configured to be used in a semiconductor memory, wherein the semiconductor memory comprises a Data Queue (DQ) port and a memory bank, the read operation circuit comprising:
   a data determination module connected to the memory bank, wherein the data determination module is configured to read read data from the memory bank, determine whether to invert the read data according to the number of bits of low data in the read data, and to output global bus data for transmission through a global bus and inversion flag data for transmission through an inversion flag signal line;
   a data receiving module connected to the global bus and the inversion flag signal line, wherein the data receiving module is configured to determine whether to invert the global bus data according to the inversion flag data to output cache data;
   a parallel-to-serial conversion circuit connected between the data receiving module and the DQ port, wherein the parallel-to serial conversion circuit is configured to perform parallel-to-serial conversion on the cache data to generate output data of the DQ port;
   a data buffer module connected to the memory bank through the global bus; and
   a precharge module connected to a precharge signal line and configured to set an initial state of the global bus to High.

In one embodiment, the data determination module is configured to output inverted data of the read data as the global bus data and set the inversion flag data to High if the number of bits of the low data in the read data is greater than a preset value, and output original read data as the global bus data and set the inversion flag data to Low if the number of bits of the low data in the read data is less than or equal to the preset value.

In one embodiment, the read data and the global bus data are both divided into M groups, the inversion flag data having M bits, and the M-bit inversion flag data being corresponding to the M groups of read data one to one, and the M-bit inversion flag data being corresponding to the M groups of global bus data one to one, wherein the M is an integer greater than 1.

In one embodiment, each group of read data has N bits, the N being an integer greater than 1, and the data determination module being configured to output inverted data of a group of read data inputted as a corresponding group of global bus data and set 1-bit inversion flag data corresponding to the group of read data inputted to High if the number of bits of the low data in the group of read data inputted is greater than N/2, and output a group of read data inputted as a corresponding group of global bus data and set 1-bit inversion flag data corresponding to the group of read data inputted to Low if the number of bits of low data in the group of read data inputted is less than or equal to N/2.

In one embodiment, the data determination module comprises:
   a data determination unit, an input terminal of the data determination unit being connected to the memory bank, an output terminal of the data determination unit being connected to the inversion flag signal line, and the data determination unit being configured to set the inversion flag data to High if the number of bits of the low data in the read data is greater than a preset value, and set the inversion flag data to Low if the number of bits of the low data in the read data is less than or equal to the preset value; and
   a data selector, an input terminal of the data selector being connected to the data determination unit to receive the read data through the data determination unit, the input terminal of the data selector being configured to receive the inversion flag data through the inversion flag signal line, an output terminal of the data selector being connected to the global bus, and the data selector being configured to output inverted data of the read data as the global bus data if the inversion flag data is High, and output original read data as the global bus data if the inversion flag data is Low.

In one embodiment, the data selector comprises a plurality of data selection units, each of the data selection units comprising:
   a first inverter, an input terminal of the first inverter being configured to receive the inversion flag data through the inversion flag signal line;
   a second inverter, an input terminal of the second inverter being connected to the data determination unit to receive the read data from the data determination unit;

a first transmission gate, an input terminal of the first transmission gate being connected to an output terminal of the second inverter, an output terminal of the first transmission gate being connected to the global bus to output the global bus data, a negative control terminal of the first transmission gate being connected to an output terminal of the first inverter, and a positive control terminal of the first transmission gate being configured to receive the inversion flag data through the inversion flag signal line; and a second transmission gate, an input terminal of the second transmission gate being connected to the data determination unit to receive the read data from the data determination unit, an output terminal of the second transmission gate being connected to the global bus to output the global bus data, a negative control terminal of the second transmission gate being configured to receive the inversion flag data through the inversion flag signal line, and a positive control terminal of the second transmission gate being connected to the output terminal of the first inverter.

In one embodiment, the data receiving module is configured to output inverted data of the global bus data as the cache data if the inversion flag data is High, and output original global bus data as the cache data if the inversion flag data is Low.

In one embodiment, the data receiving module comprises a plurality of data receiving units, and each of the plurality of data receiving units comprising:

a third inverter, an input terminal of the third inverter being configured to receive the inversion flag data through the inversion flag signal line;

a fourth inverter, an input terminal of the fourth inverter being configured to receive the global bus data through the global bus;

a third transmission gate, an input terminal of the third transmission gate being connected to an output terminal of the fourth inverter, an output terminal of the third transmission gate being connected to the parallel-to-serial conversion circuit to output the cache data to the parallel-to-serial conversion circuit, a negative control terminal of the third transmission gate being connected to an output terminal of the third inverter, and a positive control terminal of the third transmission gate being configured to receive the inversion flag data through the inversion flag signal line; and a fourth transmission gate, an input terminal of the fourth transmission gate being configured to receive the global bus data through the global bus, an output terminal of the fourth transmission gate being connected to the parallel-to-serial conversion circuit to output the cache data to the parallel-to-serial conversion circuit, a negative control terminal of the fourth transmission gate being configured to receive the inversion flag data through the inversion flag signal line, and a positive control terminal of the fourth transmission gate being connected to the output terminal of the third inverter.

In one embodiment, the data buffer module comprises a plurality of NMOS transistors, a gate of each of the NMOS transistors is connected to the memory bank, and a drain of the NMOS transistor is connected to the global bus. The precharge module includes a plurality of PMOS transistors and a plurality of hold circuits, wherein a gate of each of the PMOS transistors is connected to the precharge signal line, and a drain of the PMOS transistor is connected to the global bus. An input terminal and an output terminal of the hold circuit are connected to the global bus.

In a second aspect, the embodiments of the present disclosure provide a semiconductor memory, which includes a Data Queue (DQ) port, a memory bank, and a read operation circuit according to any one of the above embodiments.

In a third aspect, the embodiments of the present disclosure provide a read operation method used in a semiconductor memory, wherein the semiconductor memory comprises a Data Queue (DQ) port and a memory bank. The read operation method comprises:

setting an initial state of a global bus to High;

reading read data from the memory bank;

determining whether to invert the read data according to the number of bits of low data in the read data to output global bus data for transmission through the global bus and inversion flag data for transmission through an inversion flag signal line;

determining whether to invert the global bus data according to the inversion flag data to output cache data; and performing parallel-to-serial conversion on the cache data to generate output data of the DQ port.

In one embodiment, the determining whether to invert the read data according to the number of bits of low data in the read data to output global bus data for transmission through the global bus and inversion flag data for transmission through an inversion flag signal line comprises:

outputting inverted data of the read data as the global bus data and setting the inversion flag data to High if the number of bits of the low data in the read data is greater than a preset value; and outputting original read data as the global bus data and setting the inversion flag data to Low if the number of bits of the low data in the read data is less than or equal to the preset value.

In one embodiment, the determining whether to invert the read data according to the number of bits of low data in the read data to output global bus data for transmission through the global bus and inversion flag data for transmission through an inversion flag signal line comprises:

dividing the read data into M groups, wherein each group of read data has N bits, both the M and the N are integers greater than 1;

outputting inverted data of a group of read data inputted as a corresponding group of global bus data and setting 1-bit inversion flag data corresponding to the group of read data inputted to High if the number of bits of low data in the group of read data inputted is greater than N/2; and outputting a group of read data inputted as a corresponding group of global bus data and setting 1-bit inversion flag data corresponding to the group of read data inputted to Low if the number of bits of low data in the group of read data inputted is less than or equal to N/2.

According to the technical solutions of the embodiments of the present disclosure, more data "1" can be transmitted through a global bus having a precharge high architecture, such that the number of inversions of the internal global bus can be reduced. In this way, electric current is reduced significantly, and power consumption is decreased.

The above summary is for the purpose of illustration only and is not intended to be limiting in any way. In addition to the illustrative aspects, embodiments, and features described above, further aspects, embodiments, and features of the present disclosure will be readily apparent by reference to the drawings and the following detailed description.

BRIEF DESCRIPTION OF THE DRAWINGS

In the drawings, the same reference numerals denote the same or similar parts or elements throughout the several drawings unless otherwise specified. These drawings are not necessarily drawn to scale. It should be understood that these drawings depict only some embodiments disclosed according to the present disclosure and should not be deemed as limitations on the scope of the present disclosure.

Figure 1:
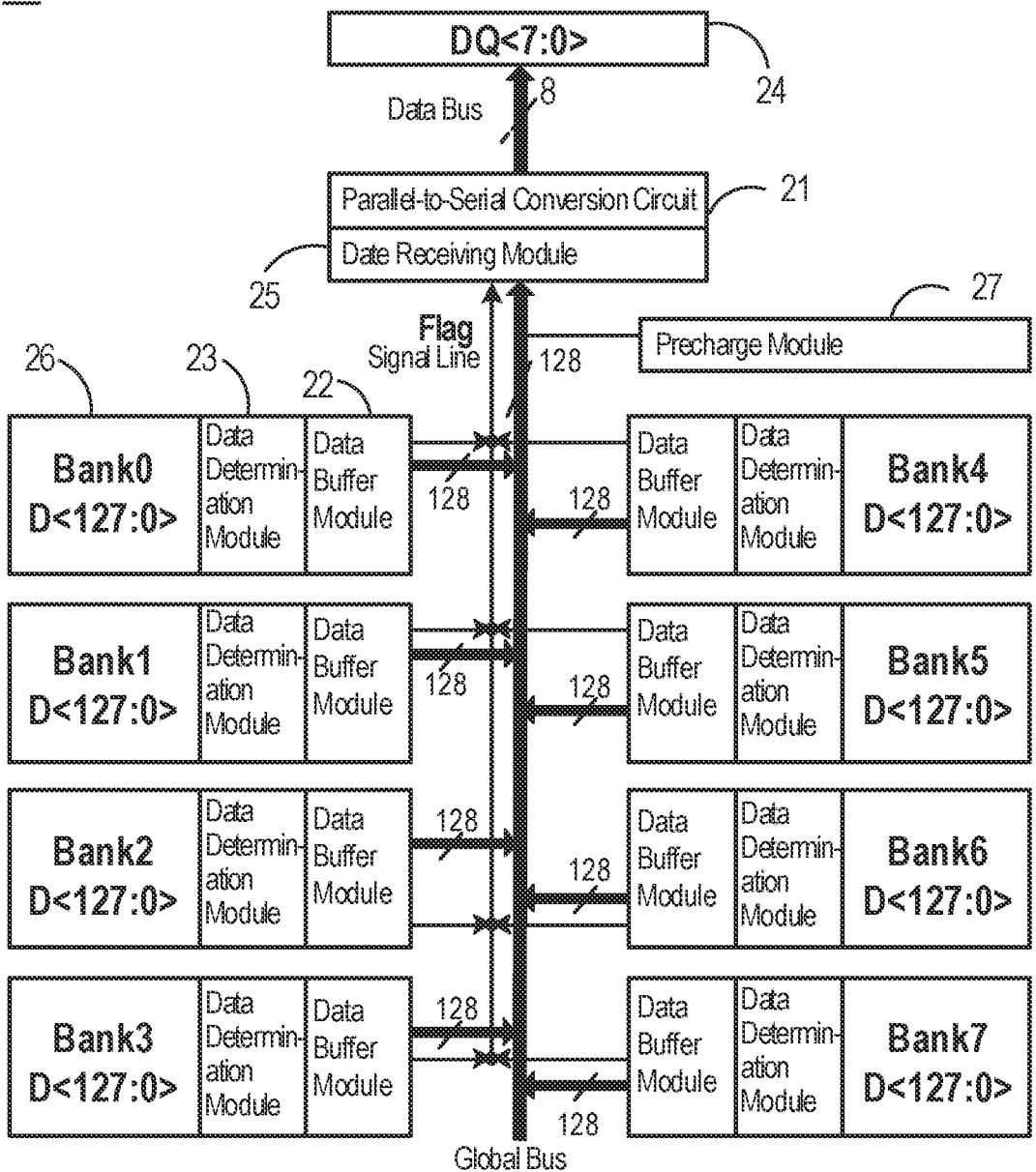
FIG. 1 schematically illustrates a block diagram of a partial structure of a semiconductor memory according to an implementation manner of this embodiment.

Reference numbers in the accompanying drawings:
  20: semiconductor memory;
  21: parallel-to-serial conversion circuit;
  22: data buffer module;
  23: data determination module;
  24: DQ port;
  25: data receiving module;
  26: memory bank;
  27: precharge module;
  221: PMOS transistor;
  222: NMOS transistor;
  223: hold circuit;
  231: data determination unit;
  232: data selector;
  232': data selection unit;
  232A: first inverter;
  232B: second inverter;
  232C: first transmission gate;
  232D: second transmission gate;
  250: data receiving unit;
  251: third inverter;
  252: fourth inverter;
  253: third transmission gate; and
  254: fourth transmission gate.

DETAILED DESCRIPTION

The exemplary embodiment will now be described more fully with reference to the accompanying drawings. However, the exemplary embodiments can be implemented in a variety of forms and should not be construed as being limited to the embodiments set forth herein. Rather, these embodiments are provided such that the present disclosure will be thorough and complete and will fully convey the concepts of the exemplary embodiments to those skilled in the art. The same reference numerals in the drawings denote the same or similar parts, and thus repeated description thereof will be omitted.

FIG. 1 schematically illustrates a block diagram of a partial structure of a semiconductor memory according to an implementation manner of this embodiment. As shown in FIG. 1, the semiconductor memory 20 includes a DQ port 24, a memory bank 26, and a read operation circuit. The read operation circuit includes a global bus, an inversion flag signal line, a data determination module 23, a data buffer module 22, a data receiving module 25, and a parallel-to-serial conversion circuit 21. In one embodiment, the semiconductor memory 20 is a dynamic random access memory (DRAM), such as a double data rate SDRAM 4 (abbreviated as DDR4).

In one example, as shown in FIG. 1, an active command can enable the only designated memory bank 26, and the read operation can only be performed on one memory bank 26. That is, when one memory bank among eight memory banks 26 (i.e. Bank<7:0>) is operating, the other memory banks are not operating. By means of the read operation circuit, the read data D<127:0> in the memory bank 26 outputs 8-bit output data DQ<7:0> through the DQ port 24. It is to be noted that the number of memory banks 26, the number of data bits of each memory bank 26, and the number of data bits of the DQ port 24 and the number of DQ ports 24 are not limited in this embodiment. For example, there may be one DQ port 24 configured to output 16-bit output data. There may also be two DQ ports 24, and each of the DQ ports 24 is configured to output 8-bit output data.

Figure 2:
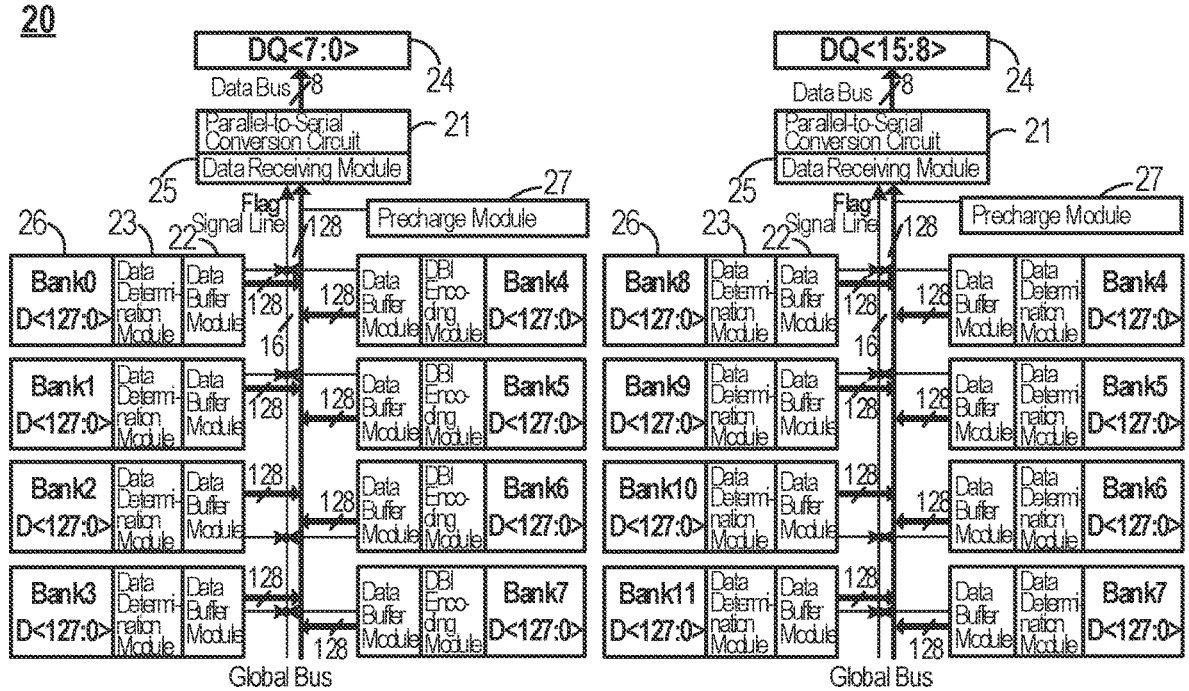
FIG. 2 schematically illustrates a block diagram of a partial structure of the semiconductor memory according to another implementation manner of this embodiment.

For example, as shown in FIG. 2, the output data DQ<7:0> is obtained by performing a read operation on a group of memory banks Bank<7:0> by one read operation circuit mentioned above, and the output data DQ<15:8> is obtained by performing a read operation on another group of memory banks Bank<15:8> by another read operation circuit mentioned above. Correspondingly, among eight memory banks 26 (i.e., Bank<15:8>) corresponding to the output data DQ<15:8>, when one memory bank is operating, the other memory banks are not operating.

The semiconductor memory 20 has an array structure, and each unit may have the same structure. However, because inputted data are different, data outputted by each unit may be different. The read operation circuit of this embodiment is introduced below by taking one of the memory banks as an example.

The data determination module 23 is connected to the memory bank 26 and is configured to read read data such as D<127:0> from the memory bank 26, and determine whether to invert the read data according to the number of bits of low data in the read data to output global bus data for transmission through a global bus and inversion flag data for transmission through an inversion flag signal line. High data may be data equal to "1", and low data may be data equal to "0". Inversion of data may be understood as inversion from "0" to "1", or inversion from "1" to "0". The inversion of a data line or a signal line may be understood as inversion from a high level to a low level, or inversion from a low level to a high level.

In one embodiment, the data determination module 23 is configured to output inverted data of the read data as the global bus data and set the inversion flag data to High if the number of bits of the low data in the read data is greater than a preset value, and output original read data as the global bus data and set the inversion flag data to Low if the number of bits of the low data in the read data is less than or equal to the preset value.

In one example, multi-bit read data is not grouped. That is, the inversion flag data may be 1-bit data. In one example, multi-bit read data may be grouped. For example, in one embodiment, the read data and the global bus data are both divided into M groups, the inversion flag data has M bits, the M-bit inversion flag data is corresponding to the M groups of read data one to one, and the M-bit inversion flag data is corresponding to the M groups of global bus data one to one, wherein the M is an integer greater than 1.

Further, each group of read data has N bits, wherein the N is an integer greater than 1. The data determination module 23 is configured to output inverted data of a group of read data inputted as a corresponding group of global bus data and set 1-bit inversion flag data corresponding to the group of read data inputted to High if the number of bits of the low data in the group of read data inputted is greater than N/2, and output a group of read data inputted as a corresponding group of global bus data and set 1-bit inversion flag data corresponding to the group of read data inputted to Low if the number of bits of low data in the group of read data inputted is less than or equal to N/2.

For example, the read data D<127:0> is divided into 16 groups, each group of read data has 8 bits, and each group of read data is corresponding to 1-bit inversion flag data. Correspondingly, the inversion flag data has 16 bits, such as Flag<15:0>. The global bus data D1'<127:0> will also be divided into 16 groups accordingly. Each 1-bit inversion flag data is corresponding to a group of global bus data. For a group of read data D<127:120>, if the number of bits equal to "0" in D<127:120> is greater than 4 bits, the corresponding Flag<15>=1, and a group of global bus data D1'<120:127> outputted is equal to the inverted data of D<127:120>; and if the number of bits equal to "0" in the read data is less than or equal to 4 bits, the corresponding Flag<15>=0, and a group of global bus data D1'<120:127> outputted is D<127:120>.

Hence, when Flag<15>=1, the global bus data D1'<127:120> outputted from the data determination module 23 is the inverted data of the read data D<127:120> of the memory bank 26 (such as Bank0). When Flag<15>=0, the global bus data D1'<127:120> outputted from the data determination module 23 is the read data D<127:120> of the memory bank 26 (such as Bank0). That is, the read data D1'<127:120>=D<127:120>. Similarly, when Flag<1>=1, the global bus data D1'<15:8> outputted from the data determination module 23 is the inverted data of the read data D<15:8> of the memory bank 26 (such as Bank0). When Flag<1>=0, the global bus data D1'<15:8> outputted from the data determination module 23 is the read data D<15:8> of the memory bank 26 (such as Bank0). That is, the global bus data D1'<15:8>=D<15:8>. When Flag<0>=1, the global bus data D1'<7:0> outputted from the data determination module 23 is the inverted data of the read data D<7:0> of the memory bank 26 (such as Bank0). When the Flag<0>=0, the global bus data D1'<7:0> outputted from the data determination module 23 is the read data D<7:0> of the memory bank 26 (such as Bank0). That is, the global bus data D1'<7:0>=D<7:0>.

In one example, there are a plurality of global buses, which are divided into M (M is an integer greater than 1) groups, wherein each global bus transmits 1-bit global bus data. For example, there are 128 global buses, which are divided into 16 groups. The global bus <0> transmits global bus data D1'<0>; the global bus <1> transmits global bus data D1'<1>; ... ; and the global bus <127> transmits global bus data D1'<127>.

In one example, there are 16 inversion flag signal lines, and each inversion flag signal line transmits 1-bit inversion flag data. For example, the inversion flag signal line <0> transmits inversion flag data Flag<0>, and is corresponding to the global bus data D1'<7:0> to manifest whether D1'<7:0> is the inverted data. The inversion flag signal line <1> transmits inversion flag data Flag<1>, and is corresponding to the global bus data D1'<15:8> to manifest whether D1'<15:8> is the inverted data; ... ; and the inversion flag signal line <15> transmits inversion flag data Flag<15>, and is corresponding to the global bus data D1'<127:120> to manifest whether D1'<127:120> is the inverted data.

Thus, there are more data "1" among the global bus data D1'<127:0> transmitted through the global bus. Accordingly, in the semiconductor memory 20 as shown in FIG. 2, there are more data "1" among the 256-bit global bus data (including the 128-bit global bus data corresponding to DQ<7:0> and the 128-bit global bus data corresponding to DQ<15:8>).

The data buffer module 22 is connected to the memory bank 26 through the global bus, and the precharge module 27 is connected to a precharge signal line and is configured to set an initial state of the global bus to High. That is, in this embodiment, the semiconductor memory 20 uses a precharge high global bus transmission structure.

Figure 3:
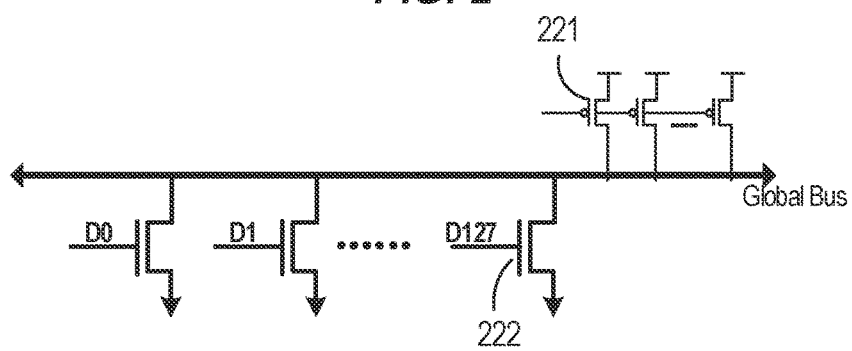
FIG. 3 schematically illustrates a circuit diagram (corresponding to one memory bank) of a data buffer module and a precharge module according to an implementation manner of this embodiment.
Figure 4:
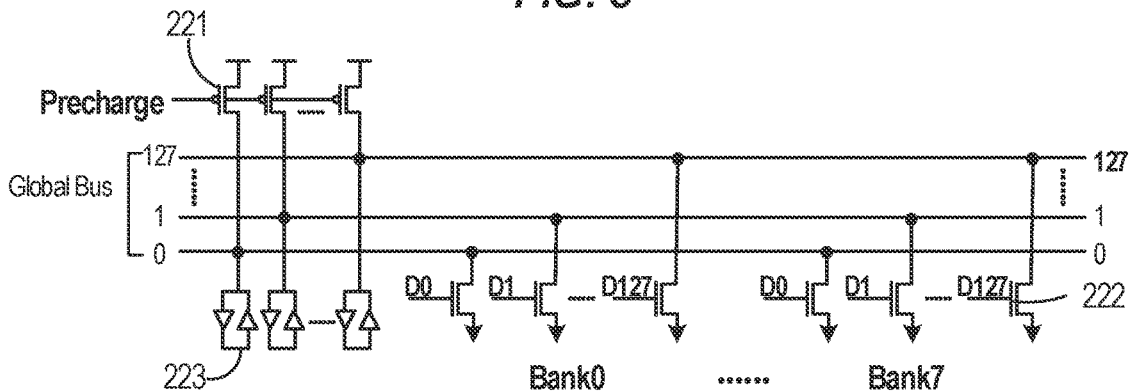
FIG. 4 schematically illustrates a circuit diagram (corresponding to a plurality of memory banks) of the data buffer module and the precharge module according to an implementation manner of this embodiment.

FIG. 3 schematically illustrates a circuit diagram (corresponding to one memory bank 26) of the data buffer module 22 and the precharge module 27 according to an implementation manner of this embodiment. FIG. 4 schematically illustrates a circuit diagram (corresponding to eight memory banks 26) of the data buffer module 22 and the precharge module 27 according to an implementation manner of this embodiment.

As shown in FIG. 3 and FIG. 4, the data buffer module 22 includes a plurality of negative channel metal oxide semiconductor (NMOS) transistors 222, and the precharge module 27 includes a plurality of positive channel metal oxide semiconductor (PMOS) transistors 221 and a plurality of hold circuits 223. A gate of the PMOS transistor 221 is connected to the precharge signal line, and a drain of the PMOS transistor 221 is connected to the global bus. A gate of the NMOS transistor 222 is connected to the memory bank 26, and a drain of the NMOS transistor 222 is connected to the global bus. An input terminal and an output terminal of the hold circuit 223 are connected to the global bus to form a positive feedback circuit.

The precharge signal line is configured to set the initial state of each global bus to High. In this process, a pull-up pulse (about 2 ns) is generated by the precharge signal line to pull up a certain global bus for a moment, and the hold circuit 223 forms a positive feedback and latches this global bus at a high level. However, the hold circuit 223 has weaker ability in pulling up and pulling down electric current. When a certain global bus needs to be inverted to a low level, this represents that a data line (i.e., a data line connected to the gate of the corresponding NMOS transistor 222) corresponding to this global bus is pulled up (also a pulse about 2 ns), such that the NMOS transistor 222 pulls down this global bus for a moment (the pull-down ability is better than the pull-up ability of the hold circuit 223). Next, this global bus is latched to a low level through the positive feedback. In this way, inversion of the data line is completed. There are more data "1" among the global bus data D1'<127:0>, and thus fewer inversions are required. Therefore, the IDD4R (read current) of the semiconductor memory will be reduced, such that the power consumption of the semiconductor memory can be reduced.

Figure 5:
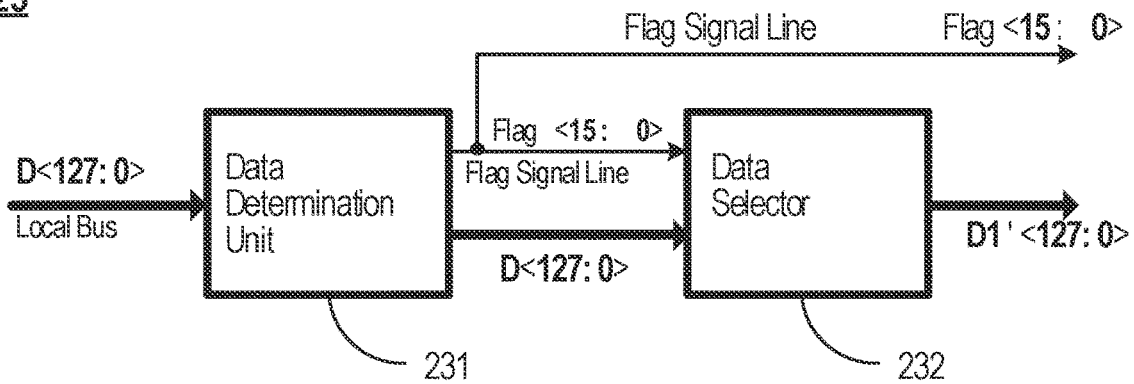
FIG. 5 schematically illustrates a block diagram of a data determination module according to an implementation manner of this embodiment.

In one embodiment, as shown in FIG. 5, the data determination module 23 includes a data determination unit 231 and a data selector 232.

An input terminal of the data determination unit 231 is connected to the memory bank 26 through a local bus, and an output terminal of the data determination unit 231 is connected to the inversion flag signal line and is connected to an input terminal of the data selector 232. The data determination unit 231 is configured to set the inversion flag data to High if the number of bits of the low data in the read data is greater than a preset value, and set the inversion flag data to Low if the number of bits of the low data in the read data is less than or equal to the preset value.

In one example, the data determination unit 231 may include a plurality of data determination subunits, and each of the data determination subunits is configured to process a group of read data, and then output 1-bit inversion flag data. For example, there may be 16 data selection unit subunits, which are respectively corresponding to 16 groups of read data, and then 16-bit inversion flag data is outputted, wherein each group of read data may have 8 bits.

An input terminal of the data selector 232 is connected to the data determination unit 231 to receive the read data through the data determination unit 231, the input terminal of the data selector 232 is configured to receive the inversion flag data through the inversion flag signal line, and an output terminal of the data selector 232 is connected to the global bus. The data selector 232 is configured to output inverted data of the read data as the global bus data if the inversion flag data is High, and output original read data as the global bus data if the inversion flag data is Low.

In one embodiment, the data selector 232 includes a plurality of data selection units 232', and each of the data selection units 232' is configured to process 1-bit inversion flag data and a group of read data. For example, there may be 16 data selection units 232', which are respectively corresponding to 16 groups of read data and 1-bit inversion flag data, wherein each group of read data may have 8 bits.

Figure 6:
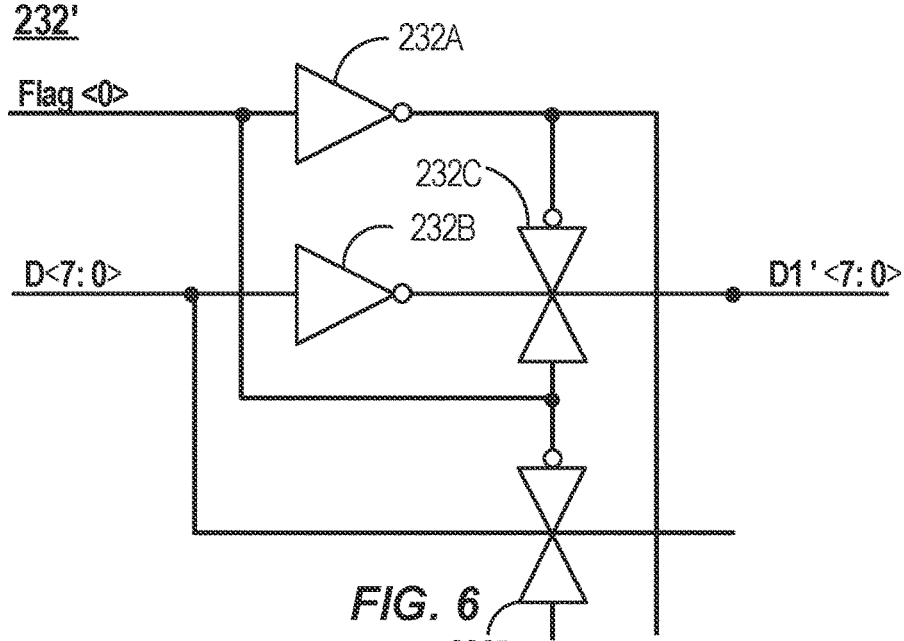
FIG. 6 schematically illustrates a block diagram of a data selection unit according to an implementation manner of this embodiment.

FIG. 6 illustrates an implementation manner of the data selection unit 232'. As shown in FIG. 6, the data selection unit 232' includes a first inverter 232A, a second inverter 232B, a first transmission gate 232C, and a second transmission gate 232D.

An input terminal of the first inverter 232A is configured to receive the inversion flag data through the inversion flag signal line. An input terminal of the second inverter 232B is connected to the data determination unit 231 to receive the read data from the data determination unit 231. An input terminal of the first transmission gate 232C is connected to an output terminal of the second inverter 232B, an output terminal of the first transmission gate 232C is connected to the global bus to output the global bus data, a negative control terminal (the upper control terminal in FIG. 6) of the first transmission gate 232C is connected to an output terminal of the first inverter 232A, and a positive control terminal (the lower control terminal in FIG. 6) of the first transmission gate 232C is configured to receive the inversion flag data through the inversion flag signal line. An input terminal of the second transmission gate 232D is connected to the data determination unit 231 to receive the read data from the data determination unit 231, an output terminal of the second transmission gate 232D is connected to the global bus to output the global bus data, a negative control terminal of the second transmission gate 232D is configured to receive the inversion flag data through the inversion flag signal line, and a positive control terminal of the second transmission gate 232D is connected to the output terminal of the first inverter 232A.

Taking Flag<0> and the read data D<7:0> as an example, as shown in FIG. 6, when Flag=1, the global bus data D1'<7:0> is the inverted data of the read data D<7:0>; and when Flag=0, the global bus data D1'<7:0> is the read data D<7:0>.

It is to be noted that a group of second inverter 232B, first transmission gate 232C and second transmission gate 232D is configured to process 1-bit read data and output 1-bit corresponding global bus data. That is, corresponding to 8-bit read data D<7:0>, there should be eight groups of second inverters 232B, first transmission gates 232C and second transmission gates 232D, and then 8-bit global bus data D1'<7:0> is outputted.

Figure 7:
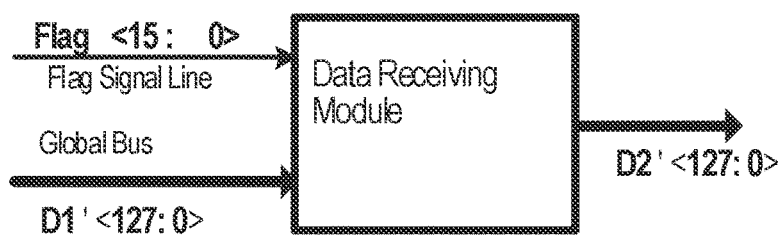
FIG. 7 schematically illustrates a block diagram of a data receiving module according to an implementation manner of this embodiment.

As shown in FIG. 1, FIG. 2 and FIG. 7, the read operation circuit in this embodiment further includes a data receiving module 25 connected to the global bus and the inversion flag signal line respectively and configured to determine whether to invert the global bus data according to the inversion flag data to output cache data. For example, the data receiving module 25 is configured to output inverted data of the global bus data as the cache data if the inversion flag data is High, and output original global bus data as the cache data if the inversion flag data is Low.

Thus, the cache data is reverted to the read data in the memory bank 26. Further, neither data nor functions of an external port such as the DQ port 24 and a DBI port (not shown in the figures) of the semiconductor memory 20 will be changed.

Figure 8:
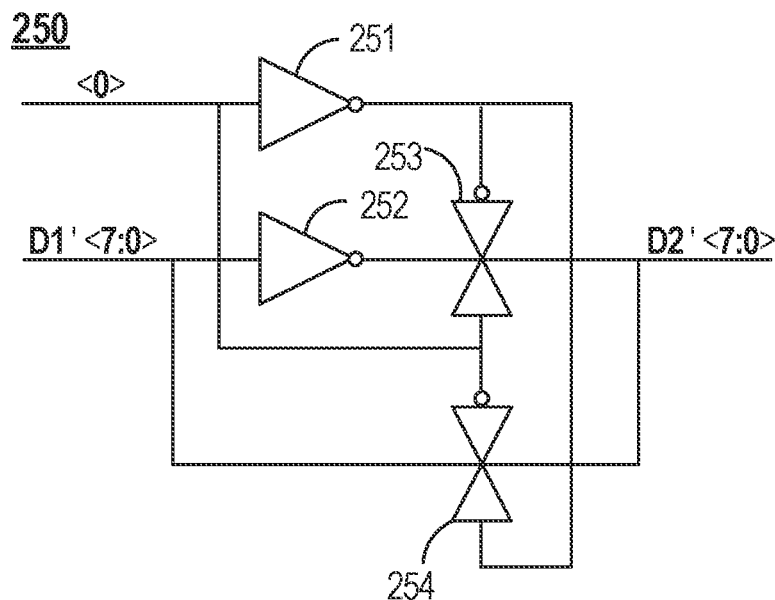
FIG. 8 schematically illustrates a block diagram of a data receiving unit according to an implementation manner of this embodiment.

In one embodiment, the data receiving module 25 may include a plurality of data receiving units 250, and each of the data receiving units 250 is configured to process 1-bit inversion flag data and a group of global bus data. For example, there may be 16 data receiving units 250, which are respectively corresponding to 16 groups of global bus data and 1-bit inversion flag data. FIG. 8 illustrates an implementation manner of the data receiving unit 250.

As shown in FIG. 8, the data receiving unit 250 includes a third inverter 251, a fourth inverter 252, a third transmission gate 253, and a fourth transmission gate 254.

An input terminal of the third inverter 251 is configured to receive the inversion flag data through the inversion flag signal line. An input terminal of the fourth inverter 252 is configured to receive the global bus data through the global bus. An input terminal of the third transmission gate 253 is connected to an output terminal of the fourth inverter 252, an output terminal of the third transmission gate 253 is connected to the parallel-to-serial conversion circuit 21 to output the cache data to the parallel-to-serial conversion circuit 21, a negative control terminal (the upper control terminal in FIG. 8) of the third transmission gate 253 is connected to an output terminal of the third inverter 251, and a positive control terminal of the third transmission gate 253 is configured to receive the inversion flag data through the inversion flag signal line. An input terminal of the fourth transmission gate 254 is configured to receive the global bus data through the global bus, an output terminal of the fourth transmission gate 254 is connected to the parallel-to-serial conversion circuit 21 to output the cache data to the parallel-to-serial conversion circuit 21, a negative control terminal (the upper control terminal in FIG. 8) of the fourth transmission gate 254 is configured to receive the inversion flag data through the inversion flag signal line, and a positive control terminal (the lower control terminal in FIG. 8) of the fourth transmission gate 254 is connected to the output terminal of the third inverter 251.

Taking Flag<0> and the global bus data D1'<7:0> as an example, as shown in FIG. 8, when Flag=1, the cache data D2'<7:0> is the inverted data of the global bus data D1'<7: 0>; and when Flag=0, the cache data D2'<7:0> is the global bus data D1'<7:0>. That is, D2'<7:0>=D1'<7:0>.

It is to be noted that a group of fourth inverter 252, third transmission gate 253 and fourth transmission gate 254 is configured to process 1-bit global bus data and output corresponding 1-bit cache data. That is, corresponding to 8-bit global bus data D1'<7:0>, there should be eight groups of fourth inverters 252, third transmission gates 253 and fourth transmission gates 254, and then 8-bit cache data D2'<7:0> is outputted.

As shown in FIG. 1 and FIG. 2, the read operation circuit in this embodiment further includes a parallel-to-serial conversion circuit 21. The parallel-to-serial conversion circuit 21 is connected to the data receiving module 25 to perform parallel-to-serial conversion on the cache data to generate output data of the DQ port 24, and to transmit the output data to the DQ port 24 through a data bus. For example, the parallel-to-serial conversion circuit 21 performs parallel-to-serial conversion on 128-bit cache data D2'<127:0> corresponding to Bank 0 to generate 8-bit output data DQ<7:0>.

According to the semiconductor memory 20 of this embodiment, in the process of reading data (DQ<7: 0>=<00000000>; DQ<15:8>=<00000000>) from the semiconductor memory 20, the global bus data has 256 bits. If it is needed to invert 256-bit global bus data, it is only needed to invert 32-bit inversion flag data, such that the IDD4R electric current will be reduced significantly.

In practical applications, the semiconductor memory 20 of this embodiment also includes other structures such as a sense amplifier and a precharge circuit, which are not repeated in this embodiment because they belong to the existing technologies.

Figure 9:
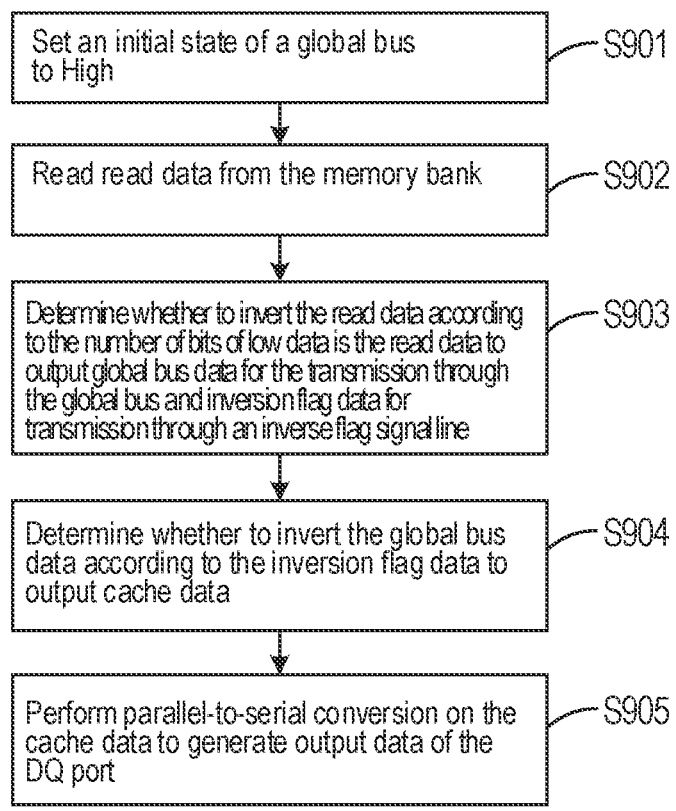
FIG. 9 schematically illustrates a flowchart of a read operation method according to an implementation manner of this embodiment.

FIG. 9 schematically illustrates a flowchart of a read operation method according to an implementation manner of this embodiment. The read operation method may be used in the semiconductor memory 20. as shown in FIG. 9, the read operation method may include:

Step S901: setting an initial state of a global bus to High;
Step S902: reading read data from the memory bank;
Step S903: determining whether to invert the read data according to the number of bits of low data in the read data to output global bus data for transmission through the global bus and inversion flag data for transmission through an inversion flag signal line;
Step S904: determining whether to invert the global bus data according to the inversion flag data to output cache data; and
Step S905: performing parallel-to-serial conversion on the cache data to generate output data of the DQ port.

In one embodiment, the Step S903 may include: outputting inverted data of the read data as the global bus data and setting the inversion flag data to High if the number of bits of the low data in the read data is greater than a preset value; and outputting original read data as the global bus data and setting the inversion flag data to Low if the number of bits of the low data in the read data is less than or equal to the preset value.

In one embodiment, the Step S903 may include: dividing the read data into M groups, wherein each group of read data has N bits, and both the M and the N are integers greater than 1; outputting inverted data of a group of read data inputted as a corresponding group of global bus data and setting 1-bit inversion flag data corresponding to the group of read data inputted to High if the number of bits of low data in the group of read data inputted is greater than N/2; and outputting a group of read data inputted as a corresponding group of global bus data and setting 1-bit inversion flag data corresponding to the group of read data inputted to Low if the number of bits of low data in the group of read data inputted is less than or equal to N/2.

The read operation circuit provided by the embodiments of the present disclosure is used in a semiconductor memory whose global bus transmission structure is a precharge high architecture. By inverting the read data by the data determination module, more data "1" can be transmitted through the global bus, such that the number of inversions of the internal global bus can be reduced. In this way, electric current may be reduced significantly, and power consumption may be decreased.

Reference throughout this specification to the terms "one embodiment," "some embodiments," "one example," "an example," or "some examples," means that a feature, structure, material, or characteristic described in connection with the embodiment or example is included in at least one embodiment or example of the present disclosure. Furthermore, the features, structures, materials, or characteristics described may be combined in any suitable manner in one or more embodiments or examples. In addition, without contradiction, those skilled in the art may combine different embodiments or examples described in the specification and features of different embodiments or examples.

In addition, the features, structures, or characteristics described may be combined in one or more embodiments in any suitable manner. However, those skilled in the art will appreciate that one or more of the details may be practiced without practicing the technical solutions of the present disclosure, and other methods, components, materials, devices, steps, and the like may be employed. In other instances, well-known structures, methods, devices, implementations, materials, or operations are not shown or described in detail to avoid obscuring aspects of the present disclosure.

Terms "first" and "second" are used only for purposes of description and are not intended to indicate or imply relative importance or to imply the number of indicated technical features. Thus, the feature defined with "first" and "second" may explicitly or implicitly include at least one such feature. In the description of the present disclosure, "a plurality of" refers to at least two, unless otherwise expressly specified.

It is to be noted that, steps of the method in the present disclosure are described in a particular order in the accompanying drawings. However, this does not require or imply to execute these steps necessarily according to the particular order, or this does not mean that the expected result cannot be implemented unless all the shown steps are executed. Additionally or alternatively, some steps may be omitted, a plurality of steps may be combined into one step for execution, and/or one step may be decomposed into a plurality of steps for execution. Moreover, the above accompanying drawings are merely illustrative description of processes included in the method according to the exemplary embodiments of the present disclosure and are not intended to limit the present disclosure. It is easy to understand that the processes shown in the above accompanying drawings do not indicate or limit time sequences of these processes. Furthermore, it is also easy to understand that these processes may be executed, for example, synchronously or asynchronously in a plurality of modules.

In addition, although the spirit and the principle of the present disclosure have been described with reference to several embodiments, it should be understood that the present disclosure is not limited to these embodiments disclosed, and the division of various aspects does not mean that the features in these aspects cannot be combined to get benefits, and this division is only for ease of expression. The present disclosure is intended to cover various modifications and equivalent arrangements included within the spirit and scope of the appended claims.

The above-mentioned embodiments are merely embodiments of the present disclosure, but the protection scope of the present disclosure is not limited thereto. Any variation or substitution easily conceivable to a person of ordinary skills in the art within the technical scope disclosed in the present disclosure shall fall into the protection scope of the present disclosure. Therefore, the protection scope of the present disclosure shall be subject to the protection scope of the claims.

What is claimed is:

1. A read operation circuit configured to be used in a semiconductor memory, wherein the semiconductor memory comprises a Data Queue (DQ) port and a memory bank, the read operation circuit comprising:
   a data determination module connected to the memory bank, wherein the data determination module is configured to read data from the memory bank, determine whether to invert the read data according to number of bits of low data in the read data, and to output global bus data for transmission through a global bus and inversion flag data for transmission through an inversion flag signal line;
   a data receiving module connected to the global bus and the inversion flag signal line, wherein the data receiving module is configured to determine whether to invert the global bus data according to the inversion flag data and to output cache data;
   a parallel-to-serial conversion circuit connected between the data receiving module and the DQ port, wherein the parallel-to-serial conversion circuit is configured to perform parallel-to-serial conversion on the cache data and to generate output data of the DQ port;
   a data buffer module connected to the memory bank through the global bus; and
   a precharge module connected to a precharge signal line and configured to set an initial state of the global bus to High.

2. The read operation circuit according to claim 1, wherein the data determination module is configured to output inverted data of the read data as the global bus data and set the inversion flag data to High if the number of bits of the low data in the read data is greater than a preset value, and output original read data as the global bus data and set the inversion flag data to Low if the number of bits of the low data in the read data is less than or equal to the preset value.

3. The read operation circuit according to claim 1, wherein the read data and the global bus data are both divided into M groups, the inversion flag data having M bits, and the M-bits inversion flag data being corresponding to the M groups of read data one to one, and the M-bits inversion flag data being corresponding to the M groups of global bus data one to one, wherein the M is an integer greater than 1.

4. The read operation circuit according to claim 3, wherein each group of read data has N bits, the N being an integer greater than 1, and the data determination module being configured to output inverted data of a group of read data inputted as a corresponding group of global bus data and set 1-bit inversion flag data corresponding to the group of read data inputted to High if the number of bits of low data in the group of read data inputted is greater than N/2, and output a group of read data inputted as a corresponding group of global bus data and set 1-bit inversion flag data corresponding to the group of read data inputted to Low if the number of bits of low data in the group of read data inputted is less than or equal to N/2.

5. The read operation circuit according to claim 1, wherein the data determination module comprises:
   a data determination unit, an input terminal of the data determination unit being connected to the memory bank, an output terminal of the data determination unit being connected to the inversion flag signal line, and the data determination unit being configured to set the inversion flag data to High if the number of bits of the low data in the read data is greater than a preset value, and set the inversion flag data to Low if the number of bits of the low data in the read data is less than or equal to the preset value; and
   a data selector, an input terminal of the data selector being connected to the data determination unit to receive the read data through the data determination unit, and the input terminal of the data selector being configured to receive the inversion flag data through the inversion flag signal line, an output terminal of the data selector being connected to the global bus, and the data selector being configured to output inverted data of the read data as the global bus data if the inversion flag data is High, and output original read data as the global bus data if the inversion flag data is Low.

6. The read operation circuit according to claim 5, wherein the data selector comprises a plurality of data selection units, each of the plurality of data selection units comprising:
   a first inverter, an input terminal of the first inverter being configured to receive the inversion flag data through the inversion flag signal line;
   a second inverter, an input terminal of the second inverter being connected to the data determination unit to receive the read data from the data determination unit;
   a first transmission gate, an input terminal of the first transmission gate being connected to an output terminal of the second inverter, an output terminal of the first transmission gate being connected to the global bus to output the global bus data, a negative control terminal of the first transmission gate being connected to an output terminal of the first inverter, and a positive control terminal of the first transmission gate being configured to receive the inversion flag data through the inversion flag signal line; and
   a second transmission gate, an input terminal of the second transmission gate being connected to the data determination unit to receive the read data from the data determination unit, an output terminal of the second transmission gate being connected to the global bus to output the global bus data, a negative control terminal of the second transmission gate being configured to receive the inversion flag data through the inversion flag signal line, and a positive control terminal of the second transmission gate being connected to the output terminal of the first inverter.

7. The read operation circuit according to claim 1, wherein the data receiving module is configured to output inverted data of the global bus data as the cache data if the inversion flag data is High, and output original global bus data as the cache data if the inversion flag data is Low.

8. The read operation circuit according to claim 1, wherein the data receiving module comprises a plurality of data receiving units, each of the plurality of data receiving units comprising:
   a third inverter, an input terminal of the third inverter being configured to receive the inversion flag data through the inversion flag signal line;
   a fourth inverter, an input terminal of the fourth inverter being configured to receive the global bus data through the global bus;
   a third transmission gate, an input terminal of the third transmission gate being connected to an output terminal of the fourth inverter, an output terminal of the third transmission gate being connected to the parallel-to-serial conversion circuit to output the cache data to the parallel-to-serial conversion circuit, a negative control terminal of the third transmission gate being connected to an output terminal of the third inverter, and a positive control terminal of the third transmission gate being configured to receive the inversion flag data through the inversion flag signal line; and
   a fourth transmission gate, an input terminal of the fourth transmission gate being configured to receive the global bus data through the global bus, an output terminal of the fourth transmission gate being connected to the parallel-to-serial conversion circuit to output the cache data to the parallel-to-serial conversion circuit, a negative control terminal of the fourth transmission gate being configured to receive the inversion flag data through the inversion flag signal line, and a positive control terminal of the fourth transmission gate being connected to the output terminal of the third inverter.

9. The read operation circuit according to claim 1, wherein the data buffer module comprises a plurality of NMOS transistors, a gate of a first NMOS transistor being connected to the memory bank, a drain of the first NMOS transistor being connected to the global bus; and wherein the precharge module comprises a plurality of PMOS transistors and a plurality of hold circuits, a gate of a first PMOS transistor being connected to the precharge signal line, a drain of the first PMOS transistor being connected to the global bus, and an input terminal and an output terminal of a first hold circuit being connected to the global bus.

10. A semiconductor memory, comprising a Data Queue (DQ) port, a memory bank, and a read operation circuit, wherein the read operation circuit comprising:
    a data determination module connected to the memory bank, wherein the data determination module is configured to read read data from the memory bank, determine whether to invert the read data according to the number of bits of low data in the read data, and to output global bus data for transmission through a global bus and inversion flag data for transmission through an inversion flag signal line; a data receiving module connected to the global bus and the inversion flag signal line, wherein the data receiving module is configured to determine whether to invert the global bus data according to the inversion flag data and to output cache data;
    a parallel-to-serial conversion circuit connected between the data receiving module and the DQ port, wherein the parallel-to-serial conversion circuit is configured to perform parallel-to-serial conversion on the cache data and to generate output data of the DQ port;
    a data buffer module connected to the memory bank through the global bus; and
    a precharge module connected to a precharge signal line and configured to set an initial state of the global bus to High.

11. A read operation method used in a semiconductor memory, wherein the semiconductor memory comprises a Data Queue (DQ) port and a memory bank, the read operation method comprising:
    setting an initial state of a global bus to High;
    reading read data from the memory bank;
    determining whether to invert the read data according to number of bits of low data in the read data to output global bus data for transmission through the global bus and inversion flag data for transmission through an inversion flag signal line;
    determining whether to invert the global bus data according to the inversion flag data to output cache data; and
    performing parallel-to-serial conversion on the cache data to generate output data of the DQ port.

12. The read operation method according to claim 11, wherein the determining whether to invert the read data according to the number of bits of low data in the read data to output global bus data for transmission through the global bus and inversion flag data for transmission through an inversion flag signal line comprises:
    outputting inverted data of the read data as the global bus data and setting the inversion flag data to High if the number of bits of the low data in the read data is greater than a preset value; and
    outputting original read data as the global bus data and setting the inversion flag data to Low if the number of bits of the low data in the read data is less than or equal to the preset value.

13. The read operation method according to claim 11, wherein the determining whether to invert the read data according to the number of bits of low data in the read data to output global bus data for transmission through the global bus and inversion flag data for transmission through an inversion flag signal line comprises:
    dividing the read data into M groups, wherein each group of read data has N bits, both the M and the N being integers greater than 1;
    outputting inverted data of a group of read data inputted as a corresponding group of global bus data and setting 1-bit inversion flag data corresponding to the group of read data inputted to High if the number of bits of low data in the group of read data inputted is greater than N/2; and
    outputting a group of read data inputted as a corresponding group of global bus data and setting 1-bit inversion flag data corresponding to the group of read data inputted to Low if the number of bits of low data in the group of read data inputted is less than or equal to N/2.

* * * * *